US007045954B2

(12) United States Patent
Hung et al.

(10) Patent No.: US 7,045,954 B2
(45) Date of Patent: May 16, 2006

(54) ORGANIC LIGHT-EMITTING DEVICE WITH REDUCTION OF AMBIENT-LIGHT-REFLECTION BY DISPOSING A MULTILAYER STRUCTURE OVER A SEMI-TRANSPARENT CATHODE

(75) Inventors: Liang-sun Hung, Webster, NY (US); Zhiyuan Xie, Changchun (CN)

(73) Assignee: City University of Hong Kong, Kowloon (HK)

( * ) Notice: Subject to any disclaimer, the term of this patent is extended or adjusted under 35 U.S.C. 154(b) by 147 days.

(21) Appl. No.: 10/463,689

(22) Filed: Jun. 17, 2003

(65) Prior Publication Data

US 2004/0256983 A1 Dec. 23, 2004

(51) Int. Cl.
*H05B 33/00* (2006.01)
*H05B 33/28* (2006.01)

(52) U.S. Cl. .................. 313/506; 313/504; 313/512; 257/40

(58) Field of Classification Search ........ 313/503–512; 428/690
See application file for complete search history.

(56) References Cited

U.S. PATENT DOCUMENTS

| | | | | |
|---|---|---|---|---|
| 4,885,211 A | * | 12/1989 | Tang et al. ................ | 428/457 |
| 5,504,389 A | * | 4/1996 | Dickey ..................... | 313/506 |
| 6,211,613 B1 | * | 4/2001 | May ......................... | 313/504 |
| 6,429,451 B1 | | 8/2002 | Hung et al. ................ | 257/40 |
| 6,551,651 B1 | * | 4/2003 | Hofstra et al. ............ | 427/66 |
| 6,558,820 B1 | * | 5/2003 | Raychaudhuri et al. ... | 428/690 |
| 6,707,248 B1 | * | 3/2004 | Burroughes et al. ...... | 313/504 |
| 6,750,609 B1 | * | 6/2004 | Aziz et al. ................ | 313/506 |

FOREIGN PATENT DOCUMENTS

EP 1076368 A2 * 2/2001

OTHER PUBLICATIONS

Krasnov, A., "High-contrast organic light-emitting diodes on flexible substrates", Applied Physics Letters, vol. 80, No. 20, May 20, 2002, pp. 3853-3855.

* cited by examiner

*Primary Examiner*—Karabi Guharay
*Assistant Examiner*—Sikha Roy
(74) *Attorney, Agent, or Firm*—Bose McKinney & Evans LLP

(57) ABSTRACT

An organic light-emitting device capable of reducing ambient-light-reflection from a cathode includes a light-transmissive substrate, a light-transmissive anode, an organic light-emitting structure, a semi-transparent cathode having a work function below 4.0 eV and a refractive index greater than 1, and a multilayer structure, which is combined with the cathode to reduce reflection of ambient-light entering the device.

37 Claims, 9 Drawing Sheets

ORGANIC LIGHT-EMITTING DEVICE WITH REDUCTION OF AMBIENT-LIGHT-REFLECTION BY DISPOSING A MULTILAYER STRUCTURE OVER A SEMI-TRANSPARENT CATHODE

FIELD OF THE INVENTION

The present invention generally relates to organic light-emitting devices. More particularly, this invention relates to devices which have a multilayer structure over a semi-transparent cathode to reduce ambient-light-reflection.

BACKGROUND OF THE INVENTION

Conventional organic light-emitting diodes (OLEDs) have a transparent substrate, typically indium-tin-oxide (ITO) glass, through which the light is emitted, and the surface electrode such as MgAg or LiF/Al is highly reflective. The electrode provides a surface from which internally generated light is reflected and directed toward the glass substrate, and thus improves the brightness of the emission. However, such an electrode also reflects ambient-light entering the device structure, thereby degrading the visually perceived contrast of the emitted light, as viewed by an observer. In numerous practical applications, it is of importance that an OLED can be easily viewed under ambient-light conditions ranging from total darkness to total sunshine so that a sufficient reduction is required in reflection of ambient-light from the mirror-like surface of the electrode. A well-known approach to reducing glare attributed to ambient-light is to use polarizers, particularly circular polarizers, which may be bonded to an outside surface of the light-transmissive substrate. However, the use of polarizers adds additional cost, and a polarizer bonded to a substrate is not a part of the integral layer structure of an OLED.

Hung and Madathil have disclosed an OLED with an absorbing layer formed of oxygen-deficient zinc oxide in U.S. Pat. No. 6,429,451. In such a case the zinc oxide layer was combined with an ultrathin bilayer of LiF/Al between the absorbing layer and the Alq layer to form an OLED with sufficient reduction in ambient-light-reflection from the mirror-like surface of the metal electrode through optical destructive interference. A. N. Krasnov disclosed that an absorbing layer of co-deposited Al and SiO combined with an ultrathin bilayer of LiF/Al between the absorbing layer and the Alq layer formed a reflection-less cathode ("High-contrast organic light-emitting diodes on flexible substrate" Alexey N. Krasnov, Appl. Phys. Lett. 80, 3853 (2002)). However, the deposition of oxygen-deficient zinc oxide by an electron beam is not compatible to OLED preparation, as the devices are extremely sensitive to radiation damage incurred in the deposition process. It is extremely difficult to control the composition of the absorbing layer formed of oxygen-deficient zinc oxide or mixed Al and SiO, and any deviation from an optimum composition would result in a significant change in its resistivity, refractive index & optical absorbance and thus considerably affect optical interference. Moreover the reflectance in the prior art is reported to be less than 20% at wavelengths of about 410 nm and 690 nm, and less than about 10% only at intermediate wavelengths. This reflectance is still too high for the structure to be used in applications. It should also be noted that the data were taken when light was directed to the glass surface of the multilayer structures at an angle of 20° relative to the normal of the sample. It is well known that the destructive interference has a strong dependence on the incident angle, and the reflection can be much higher when the incident angle is beyond 45°.

SUMMARY OF THE INVENTION

It is an object of the present invention to provide an organic light-emitting device having with reduced ambient-light-reflection.

It is another object of the present invention to provide an organic light-emitting device with reduced ambient-light-reflection by combining a semitransparent cathode and a bilayer structure, which is comprised of a phase-changing layer and a highly reflective metallic layer.

It is another object of the present invention to provide an organic light-emitting device with reduced ambient-light-reflection by combining a semi-transparent cathode and a multilayer structure, which is comprised of a phase-changing layer, an absorbing metal layer, a phase-changing layer, and a highly reflective metallic layer.

The advantage of the present disclosure is that (1) the reduction of ambient-light-reflection is more significant than the prior art, (2) the reflection-reducing structure is prepared by conventional thermal evaporation without incurring damage to organic material, (3) the entire device is prepared in one thermal evaporator without vacuum break, and (4) the results are reproducible as no inorganic compound materials are used in this invented structure.

BRIEF DESCRIPTION OF THE DRAWINGS

Some embodiments of the present invention and example of the prior art will now be described by way of example and with reference to the accompanying drawings, in which.

DETAILED DESCRIPTION OF THE EMBODIMENTS

In order to more fully appreciate the construction and performance of the organic light-emitting devices having reduced ambient-light-reflection from a cathode, a prior art standard organic light-emitting device 100 of FIG. 1 will first be described.

Figure 1:
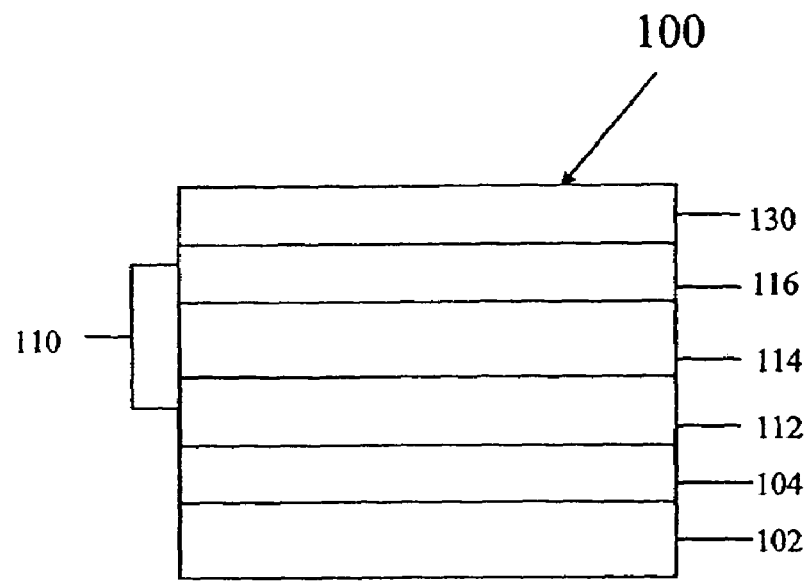
FIG. 1 is a schematic cross section of a prior art standard organic light-emitting device having a reflective cathode from which ambient light as well as light emitted toward the cathode is reflected.

In FIG. 1, an organic light-emitting device 100 has a light-transmissive substrate 102 on which is disposed a light-transmissive anode 104. An organic light-emitting structure 110 is formed between the anode 104 and a cathode 130. The organic light-emitting structure 110 is comprised of, in sequence, an organic hole-transporting layer 112, an organic light-emitting layer 114, and an organic electron-transporting layer 116. When an electrical potential difference (not shown) is applied between the anode 104 and the cathode 130, the cathode will inject electrons into the electron-transporting layer 116, and the electrons will traverse the electron-transporting layer 116 and the light-emitting layer 114. At the same time, holes will be injected from the anode 104 into the hole-transporting layer 112. The holes will migrate across the layer 112 and recombine with electrons in the light-emitting layer 114, and such recombination results in light emission from the layer 114. Approximately 50% of the generated light is emitted in a direction toward the cathode 130, and reflected from the reflective cathode surface 130. A combination of the reflected light and light emitted in a direction toward the substrate results in the light emitted through the substrate to an observer. If the device 100 is viewed under ambient-light conditions ranging from room lighting to bright sunlight, such ambient-light can readily enter the device through the light-transmissive substrate 102 and the light-transmissive anode 104. This ambient-light entering the device 100 is reflected from the cathode 130. It will degrade the visually perceived contrast of the emitted light, when viewed by an observer.

Before describing the organic light-emitting devices according to embodiments of the invention, two configurations of the prior art will be addressed.

Figure 2:
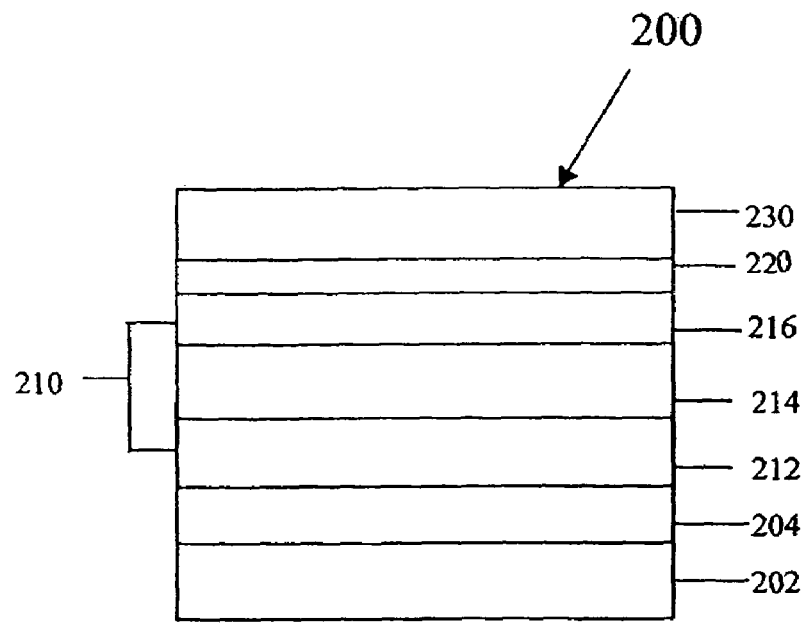
FIG. 2 is a schematic cross section of a prior art organic light-emitting device, in which the cathode is disposed over an optically absorbing and electrically conductive layer to reduce ambient-light-reflection.

In FIG. 2, a schematic cross section of a prior art device 200 differs from the construction of the device 100 of FIG. 1 in that a highly absorbing and low reflection layer 220 is provided between the cathode 230 and the organic electron-transporting layer 216. The layer 220 substantially reduces reflection of ambient-light entering the device through the light-transmissive substrate 202 and the light-transmissive anode 204, as well as reflection of the emitted light from the light-emitting layer in a direction toward the cathode 230. All other elements and their functions have been described with reference to FIG. 1. For example, the organic hole-transporting layer 212 corresponds to the organic hole-transporting layer 112 of FIG. 1. Accordingly, a further description of those elements will not be required. Particularly useful material for forming the layer 220 are electrically conductive materials having a work function less than 4.0 eV, and being substantially black in bulk form. Such preferred materials include calcium hexaboride ($CaB_6$) and lanthanum nitride (LaN).

Figure 3:
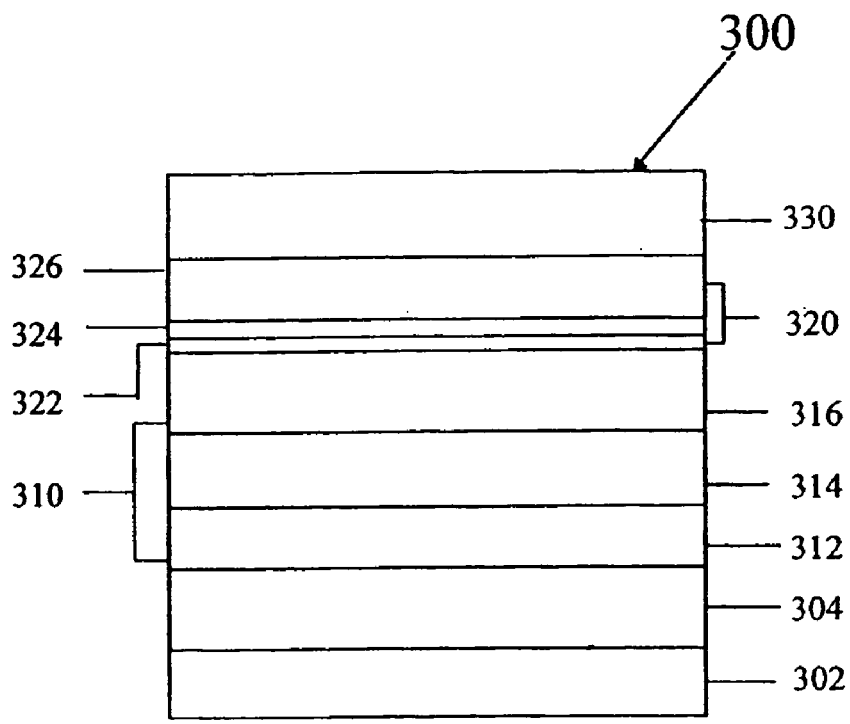
FIG. 3 is a schematic cross section of a prior art organic light-emitting device, in which the cathode is disposed over an optically absorbing layer formed of an oxygen-deficient inorganic semiconductor material to reduce ambient-light-reflection and a LiF/Al interfacial structure provides electron injection from the absorbing layer into an organic electron-transporting layer.

Turning to FIG. 3, a schematic cross section of another example of a prior art organic light-emitting device 300 is shown having a reflection-reducing layer 326 with a bilayer interfacial structure comprised of an ultrathin alkali fluoride layer 322 in contact with the organic electron-transporting layer 316, and an ultrathin aluminum layer 324 in contact with reflection-reducing layer 326, which is overlaid by a cathode layer 330.

The reflection-reducing layer 326 is formed of an n-type inorganic semiconductor material having a work function greater than 4.0 eV, and an electron affinity greater than the electron affinity of the n-type organic semiconductor from which the electron-transporting layer 316 is constructed. Electrons are readily injected from the cathode 330 into the n-type inorganic semiconductor reflection-reducing layer 326, and the bilayer interfacial structure provides for effective electron injection from the layer 326 into the organic electron-transporting layer 316. The lack of this interfacial modification structure would impede electron transport from the layer 326 into the layer 316 because of an injection barrier at the interface of these layers.

Preferred materials for forming the reflection-reducing layer 326 include inorganic n-type semiconductor materials such as, for example, zinc oxide (ZnO) and zinc sulfide (ZnS). Zinc oxide, when formed by a conventional thermal vapor deposition, so as to be oxygen-deficient, can be optically absorbing and sufficiently electrically conductive to meet all requirements of an effective reflection-reducing layer in an organic light-emitting device, except for the work function requirement. However, as indicated above, the bilayer interfacial structure, comprised of ultrathin layers 322 and 324, provides for effective electron transport from the cathode 330 into the organic electron-transporting layer 316.

Figure 4:
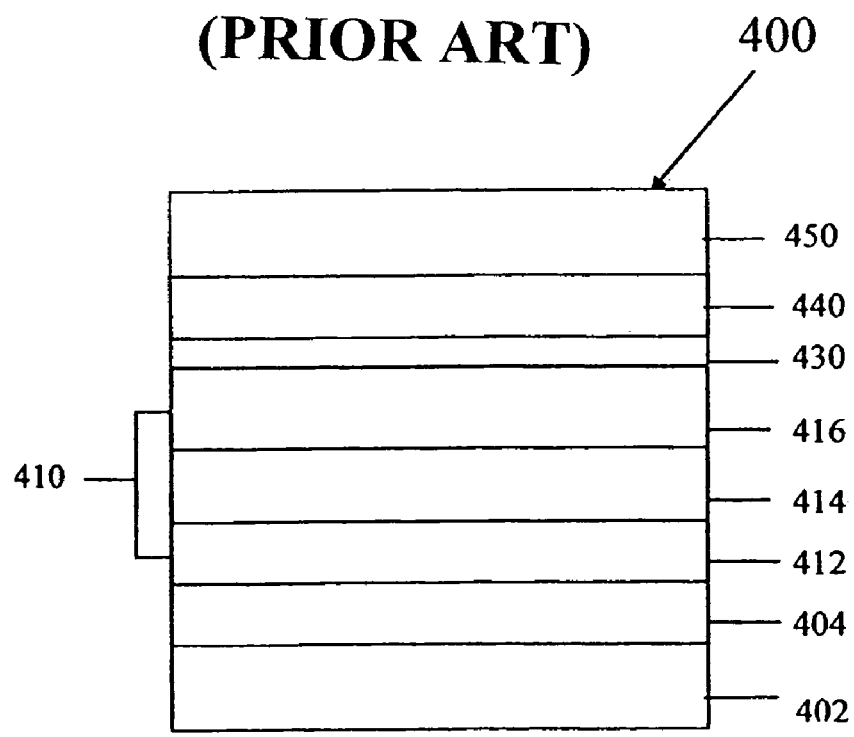
FIG. 4 is a schematic cross section view of one embodiment of an organic light-emitting device constructed in accordance with the present invention, in which the cathode is overlaid by a bilayer structure of a phase-changing layer and a highly reflective metallic surface layer to reduce ambient-light-reflection.

FIG. 4 is a schematic cross section view of one embodiment of an organic light-emitting device constructed in accordance with the present invention. An organic light-emitting device 400 has a light-transmissive substrate 402 on which is disposed a light-transmissive anode 404. An organic light-emitting structure 410 is formed over the anode 404 and comprised of, in sequence, an organic hole-transporting layer 412, an organic light-emitting layer 414, and an organic electron-transporting layer 416. A semi-transparent cathode 430 is deposited over the electron-transporting layer 416, and over the cathode is deposited a phase-changing layer 440 and a highly reflective metallic layer 450. When an electrical potential difference (not shown) is applied between the anode 404 and the cathode 430, the cathode will inject electrons into the electron-transporting layer 416, and the electrons will traverse the electron-transporting layer 416 and the light-emitting layer 414. At the same time, holes will be injected from the anode 404 into the hole-transporting layer 412. The holes will migrate across layer 412 and recombine with electrons in the light-emitting layer 414, and such recombination results in light emission from the layer 414. The structure composed of the cathode 430, phase change layer 440 and reflective metallic layer 450 substantially reduces reflection of ambient-light entering the device through the light-transmissive substrate 402 and the light-transmissive anode 404, as well as reflection of the emitted light from the light-emitting layer 414 in a direction toward the cathode 430. When ambient-light is emitted in a direction toward the cathode 430, it is reflected back from the electron-transporting layer/cathode interface, the cathode/phase-changing layer interface and the phase-changing layer/reflective metallic layer interface. Those reflected beams destructively interfere with each other and the intensity of the total reflected light is reduced to a few percents.

Figure 5:
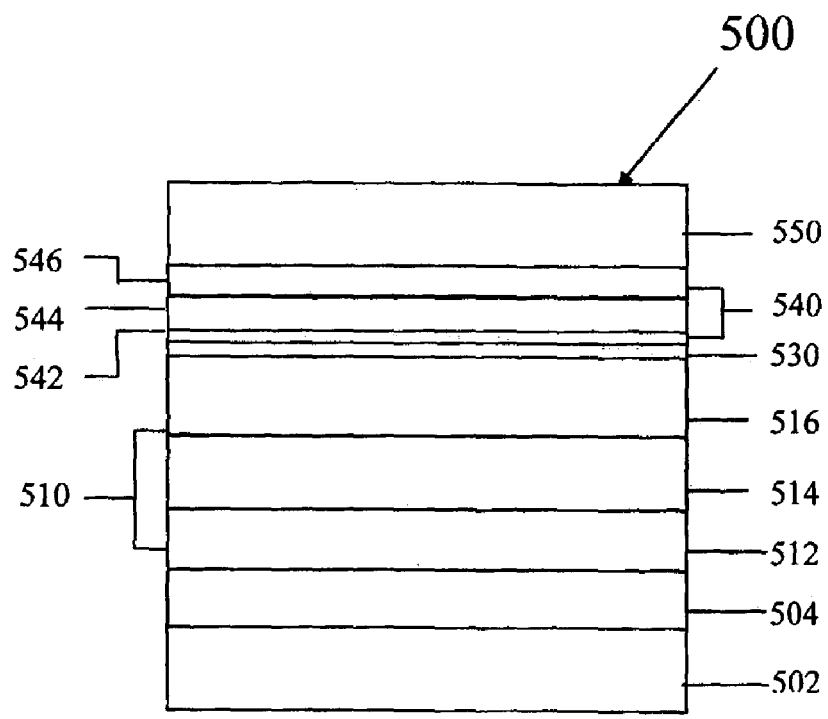
FIG. 5 is a schematic cross section of another embodiment of an organic light-emitting device constructed in accordance with the present invention, in which the cathode is overlaid by a multilayer structure comprised of a phase-changing layer, an absorbing metal layer, a second phase-changing layer, and a highly reflective metallic surface layer to reduce ambient-light-reflection.

FIG. 5 is a schematic cross section view of another embodiment of an organic light-emitting device constructed in accordance with the present invention. An organic light-emitting device 500 has a light-transmissive substrate 502 on which is disposed a light-transmissive anode 504. An organic light-emitting structure 510 is formed over the anode 504 and comprised of, in sequence, an organic hole-transporting layer 512, an organic light-emitting layer 514, and an organic electron-transporting layer 516. A semi-transparent cathode 530 is deposited over the electron-transporting layer 516, and a multilayer structure 540 is deposited over the cathode 530 and composed, in sequence, of a transparent phase-changing layer 542, an absorbing metal layer 544, a transparent phase-changing layer 546, and a highly reflective metallic surface layer 550. When an electrical potential difference (not shown) is applied between the anode 504 and the cathode 530, the cathode will inject electrons into the electron-transporting layer 516, and the electrons will traverse the electron-transporting layer 516 and the light-emitting layer 514. At the same time, holes will be injected from the anode 504 into the hole-transporting layer 512. The holes will migrate across layer 512 and recombine with electrons in the light-emitting layer 514, and such recombination results in light emission from the layer 514. The structure composed of the cathode 530 and the multilayer structure 540 substantially reduces reflection of ambient-light entering the device through the light-transmissive substrate 502 and the light-transmissive anode 504, as well as reflection of the emitted light from the light-emitting layer 514 in a direction toward the cathode 530. When sunlight is emitted in a direction toward the cathode 530, it is reflected back from the electron-transporting layer/cathode interface, the cathode/phase-changing layer interface, the phase-changing layer/absorbing metal layer interface, the absorbing metal layer/phase-changing layer interface, and the phase-changing layer/reflective metallic layer interface. Those reflected beams destructively interfere with each other and the intensity of the total reflected light is reduced to a few percents.

Figure 6:
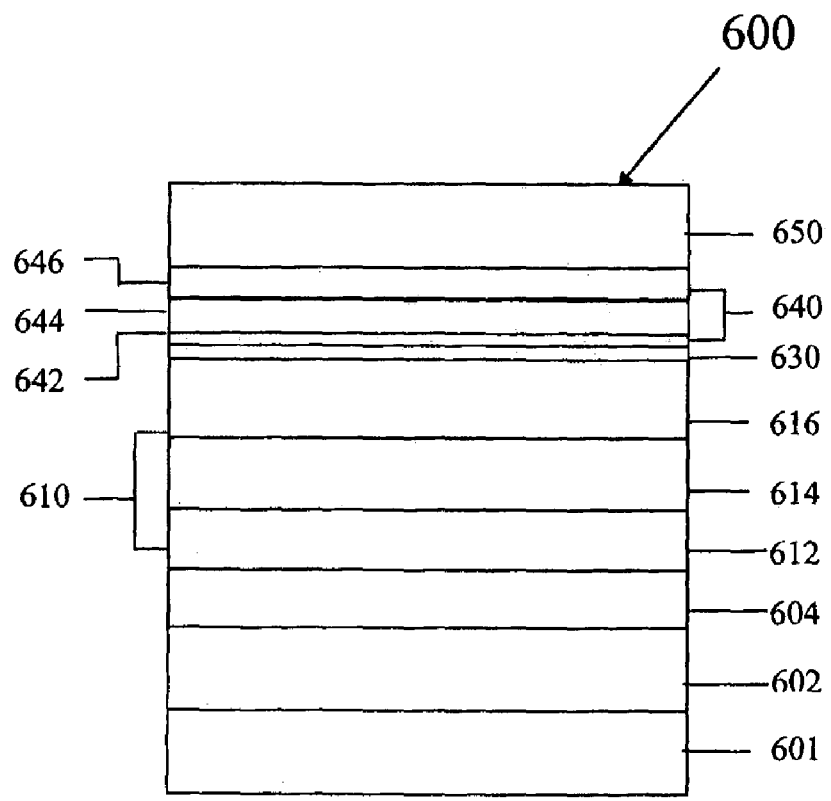
FIG. 6 is a schematic cross section of another embodiment of an organic light-emitting device constructed in accordance with the present invention, in which the back-side of a transmissive substrate is coated with a anti-reflection coating layer and the cathode is overlaid by a multilayer structure of a phase-changing layer, an absorbing metal layer, a phase-changing layer, and a highly reflective metallic surface layer to reduce ambient-light-reflection.

In FIG. 6, a schematic cross section of another embodiment of an organic light-emitting device constructed in accordance with the present invention, which is identical to the construction of device 500 of FIG. 5 except for an antireflection coating layer 601 deposited on the back-side of the transmissive substrate 602. All other elements and their functions have been described with reference to FIG. 5.

The light-transmissive substrate 402, 502 and 602 may be constructed of glass or a plastic material. The anode 404, 504 and 604 is preferably constructed of a combination of light-transmissive and electrically conductive metal oxides such as indium tin oxide (ITO) and aluminum zinc oxide (AZO). In order to function as an effective hole-injecting electrode, the anode must have a work function in excess of 4.2 eV.

The hole-transporting layer of the organic light-emitting device 412, 512 and 612 contains at least one hole-transporting aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monarylamine, diarylamine, triarylamine, or a polymeric arylamine. Exemplary monomeric triarylamines are illustrated by Klupfel et al U.S. Pat. No. 3,180,730. Other suitable triarylamines substituted with vinyl or vinyl radicals and/or containing at least one active hydrogen containing group are disclosed by Brantley et al U.S. Pat. Nos. 3,567,450 and 3,658,520.

The light-emitting layer 414, 514 and 614 of the organic light-emitting device includes a luminescent or fluorescent material, where electroluminescence is produced as a result of electron-hole pair recombination in this region. In the simplest construction, the luminescent layer comprises of a single component, which is a pure material with a high fluorescent efficiency. A well-known material is tris (8-quinolinato) aluminum, (Alq), which produces excellent green electroluminescence. A preferred embodiment of the light-emitting layer comprises a multi-component material consisting of a host material doped with one or more components of fluorescent dyes. Using this method, highly efficient light-emitting devices can be constructed. Simultaneously, the color of the EL devices can be tuned by using fluorescent dyes of different emission wavelengths in a common host material. This dopant scheme has been described in considerable details for EL devices using Alq as the host material by Tang et al in U.S. Pat. No. 4,769,292.

Preferred materials for use in forming the electron-transporting layer 416, 516 and 616 of the organic light-emitting devices of this invention are metal chelated oxinoid compounds, including chelates of oxine itself (also commonly referred to as 8-quinolinol or 8-hydroxyquinoline). Such compounds exhibit both high levels of performance and are readily fabricated in the form of thin layers.

The organic EL devices can employ a cathode constructed of any metal having a work function lower than 4.0 eV and an optical refractive index equal to or greater than 1, such as rare earth metals including lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm) and ytterbium (Yb).

The thickness of the cathode layer is in the range of 10 to 100 nm, so it is semitransparent and light can penetrate the cathode layer and enter the bilayer structure of FIG. 4 or the multilayer structure of FIGS. 5 and 6. Consequently, the light reflected back from each interface can interfere destructively Similarly the absorbing metal layer can be constructed of any metal having an optical refractive index equal to or greater than 1, such as rare earth metals including La, Ce, Pr, Nd, Pm, Sm, Eu, Gd, Tb, Dy, Ho, Er, Tm and Yb. The thickness of this metal layer is also in the range of 10 to 100 nm.

The low work function of the cathode materials ensures the formation of an effective electron injector at the metal-organic interface, and the high refractive index ensures low light-reflection at the metal-organic interface and high absorbance for light penetrating the cathode or the metal layer.

The phase-changing layer can be formed of a transparent material or a semi-transparent material, which is used to change the phase of the reflected beam and thus results in effectively destructive interference. Any transparent materials with a refractive index equal to or greater than 1.2 can be selected to form the phase-changing layer. The materials can be various organic materials, as they are transparent at the wavelength of interest and their refractive indices of the materials are equal to or greater than 1.2. For instance, α-napthylphenylbiphenyl diamine (NPB) and Tris-(8-hydroxyquinoline) aluminum (Alq) are suitable for this application, as they have very small absorbance in visible light and have a refractive index of about 1.73. Besides the organic materials, the materials of the phase-changing layer can be selected from the group consisting of fluorides, oxide, and selenide. The fluoride includes lithium fluoride, magnesium fluoride, calcium fluoride, strontium fluoride, or barium fluoride. The oxide includes silicon oxide, magnesium oxide, indium oxide, tin oxide, zinc oxide, or zirconium oxide. The selenide includes zinc selenide or sulfur selenide. The thickness of the phase-changing layer is in the range of 10 to 100 nm, and the optimal values are determined by computer simulation.

The reflective metallic layer can be formed of any elemental metal or metal alloy. The elemental metals include aluminum and silver. The thickness of the reflective metallic layer is in the range of 50 to 500 nm.

The antireflection coating layer 601 can be formed of a transparent layer. Any transparent materials with a refractive index equal to or less than 1.4 can be selected to form the anti-reflection coating layer 601. The low refractive index is necessary, as the index of glass is around 1.5. The materials can be selected from the group consisting metal fluorides and metal oxides. The fluorides include lithium fluoride, magnesium fluoride, calcium fluoride, strontium fluoride, or barium fluoride.

EXAMPLES

The following examples are presented for a further understanding of the embodiments of the invention. For purposes of brevity, the materials and the layers formed therefrom will be abbreviated as given below:

ITO: indium tin oxide (light-transmissive anode);
NPB: α-napthylphenylbiphenyl diamine (used to form the hole-transporting layers);
Alq: Tris-(8-hydroxyquinoline) aluminum (used to form the electron-transporting layers and particularly used in embodiments of this invention to form the phase-changing layer);
$CaB_6$ calcium hexaboride (used to form a highly absorbing and reflection-reducing layer in a prior art);
LiF: lithium fluoride (used to form a bilayer interfacial structure to enhance electron injection in another prior art);
Al: aluminum (used to form a cathode and a bilayer interfacial structure to enhance electron injection in the prior art and to form a highly reflective metallic layer in embodiments of this invention);
MgAg: magnesium:silver at a ratio of 10:1 by volume (used to form a cathode in the standard device);
Ag: silver (used to form an absorbing layer in embodiments of this invention);
ZnO zinc oxide (used to form a reflection-reducing layer in a prior art);
Sm; Samarium, one of the rare earth metals (used to form a cathode and an absorbing layer in embodiments of this invention).

I. Preparation of Organic Light Emitting Devices Shown in FIGS. 1–6

Preparation of a base configuration of an organic light-emitting device

A base configuration was constructed as follows:

a) a light-transmissive anode of 100 nm thick ITO-coated glass was ultrasonicated in a commercial detergent, rinsed in deionized water, degreased in toluene vapor, and contacted by a strong oxidizing agent;

b) a 75 nm thick NPB hole-transporting layer was deposited over the ITO anode by conventional thermal vapor deposition; and c) a 75 nm thick Alq electron-transporting layer was deposited over the NPB layer by conventional thermal vapor deposition. It should be noted that in this structure the Alq layer also serves as the light-emitting layer.

The above structure serves as a base configuration for each of the following examples, and is given in abbreviated form as Glass/ITO/NPB/Alq.

Example A

An organic light-emitting device was constructed as follows to serve as one "standard" device:

a MgAg cathode was deposited over the Alq layer of the base configuration by conventional thermal vapor co-deposition from two sources (Mg and Ag) to a thickness of about 100 nm, so as to provide a reflective surface of the cathode as viewed through the glass substrate in ambient-light. This prior art device is abbreviated as Glass/ITO/NPB/Alq/MgAg (FIG. 1).

Example B

An example of a prior art reduced ambient-light-reflection organic light-emitting device was constructed as follows:

a 100 nm thick $CaB_6$ layer was deposited over the Alq layer of the base configuration by electron-beam deposition, and a 100 nm thick Al cathode was deposited over the $CaB_6$ layer. This prior art device is abbreviated as Glass/ITO/NPB/Alq/$CaB_6$/Al (FIG. 2).

Example C

An example of a prior art reduced ambient-light-reflection organic light-emitting device was constructed as follows:

a bilayer interfacial structure was formed over the Alq layer of the base configuration in the following manner:

a 0.3 nm thick LiF layer was deposited over the Alq layer by conventional thermal vapor deposition, a 0.6 nm thick Al layer was formed over the LiF layer by conventional thermal vapor deposition;

a 100 nm thick ZnO reflection-reducing layer was deposited over the Al layer of the interfacial structure by electron-beam deposition, so as to provide an oxygen-deficient ($ZnO_{1-x}$) n-type semiconductor layer, and a 100 nm thick Al cathode was deposited over the $ZnO_{1-x}$ layer. This prior art of the device is abbreviated as Glass/ITO/NPB/Alq/LiF/Al/$ZnO_{1-x}$/Al (FIG. 3).

Example D

One embodiment of a reduced ambient-light-reflection organic light-emitting device was constructed in accordance with the present invention.

A bilayer interfacial structure was formed over the Alq layer of the base configuration in the following manner:

a 0.3 nm thick LiF layer was deposited over the Alq layer by conventional thermal vapor deposition, a 0.6 nm thick Al layer was formed over the LiF layer by conventional thermal vapor deposition:

a 45 nm thick Ag layer was deposited over the Al layer by conventional thermal vapor deposition, a 110 nm thick Alq phase-changing layer was formed over the Ag layer by conventional thermal vapor deposition, and then a 100 nm thick Al reflective layer was deposited over the Alq layer. This embodiment of the device is abbreviated as Glass/ITO/NPB/Alq/LiF/Al/Ag/Alq/Al (FIG. 4). The structure differs slightly from the configuration of FIG. 4, as silver has a work function of 4.4 eV and thus requires an ultrathin interfacial bilayer LiF/Al to enhance electron injection from Ag into the electron-transporting layer.

Example E

One embodiment of a reduced ambient-light-reflection organic light-emitting device was constructed in accordance with the present invention:

a 44 nm thick Sm layer was deposited as the cathode over the Alq layer by conventional thermal vapor deposition, a 64 nm thick Alq phase-changing layer was formed over the Sm layer by conventional thermal vapor deposition, and then a 100 nm thick Al surface reflective layer was deposited over the Alq layer. This embodiment of the device is abbreviated as Glass/ITO/NPB/Alq/Sm/Alq/Al (FIG. 4).

Example F

Another embodiment of a reduced ambient-light-reflection organic light-emitting device was constructed in accordance with the present invention: a 17 nm thick Sm cathode layer was deposited over the Alq layer by conventional thermal vapor deposition, a first 61 nm thick Alq phase-changing layer was formed over the first Sm layer by conventional thermal vapor deposition, a 60 nm thick second Sm absorbing layer was deposited over the first phase-changing Alq layer by conventional thermal vapor deposition, a second 61 nm thick Alq phase-changing layer was formed over the absorbing second Sm layer by conventional thermal vapor deposition, and then a 100 nm thick Al surface reflective layer was deposited over the second phase-changing Alq layer. This embodiment of the device is abbreviated as Glass/ITO/NPB/Alq/Sm/Alq/Sm/Alq/Al (FIG. 5).

Example G

Another embodiment of a reduced ambient-light-reflection organic light-emitting device was constructed in accordance with the present invention:

a 100 thick $MgF_2$ layer was coated on the back-side of the glass substrate, a 17 nm thick Sm layer as the cathode was deposited over the Alq layer by conventional thermal vapor deposition, a 61 nm thick Alq phase-changing layer was formed over the first Sm layer by conventional thermal vapor deposition, a 60 nm thick Sm absorbing layer was deposited over the Alq layer by conventional thermal vapor deposition, a second 61 nm thick Alq phase-changing layer was formed over the second Sm layer by conventional thermal vapor deposition, and then a 100 nm thick Al surface layer was deposited over the Alq layer. This embodiment of the device is abbreviated as $MgF_2$/Glass/ITO/NPB/Alq/Sm/Alq/Sm/Alq/Al (FIG. 6).

II. Results

1. Computer Simulation

Computer simulation using TFCalc Program (designed by Software Spectra Inc) was conducted on various multilayer structures to minimize reflection from the cathode by varying the thickness of each layer and to determine the dependence of reflectance on wavelengths and incident angles. In simulation light was directed to the glass surface of the multilayer structure with an incident angle α relative to the normal of the sample surface, and the reflected beam was monitored by a detector.

Figure 7:
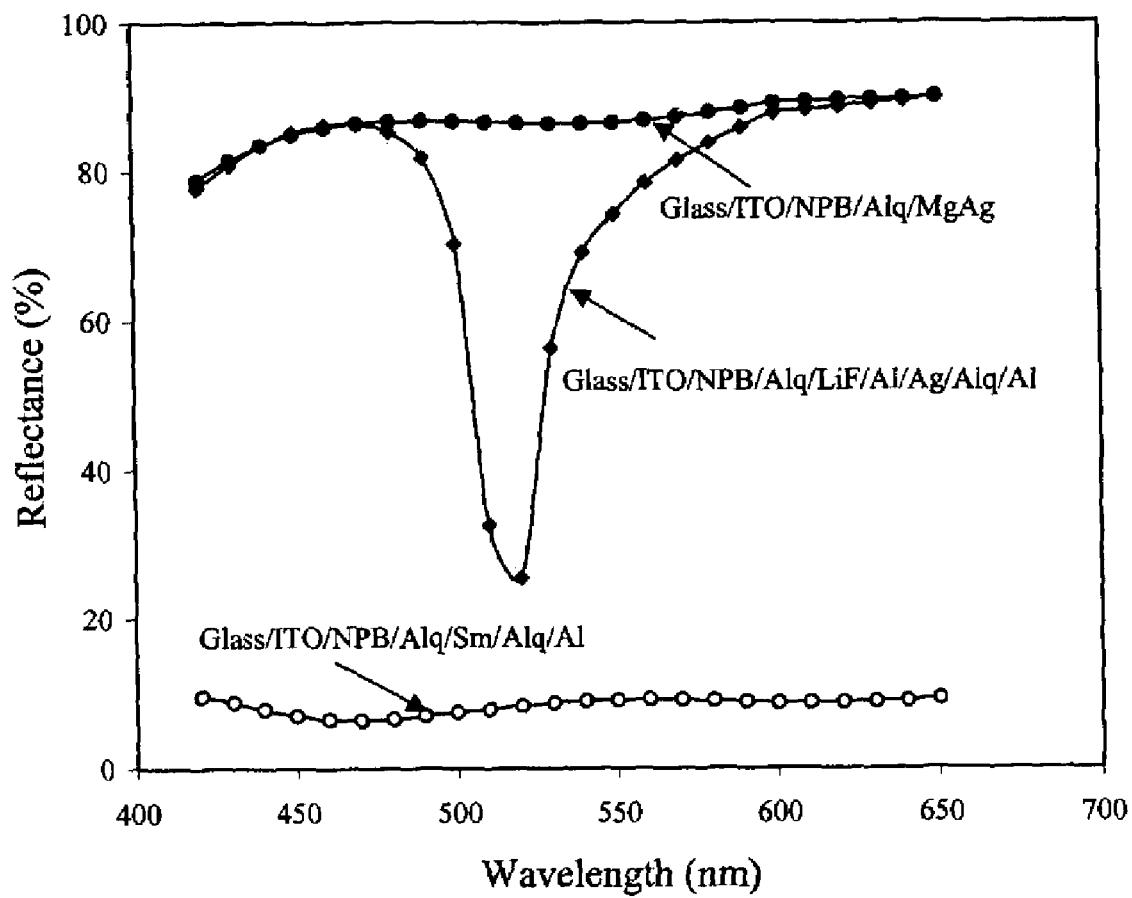
FIG. 7 shows in graphic form the spectral reflectance of a standard organic light-emitting device of FIG. 1 and two organic light-emitting devices of FIG. 4, in which the cathode is formed of samarium and silver, respectively.

The following multilayer structures have been first studied: Glass/ITO/NPB/Alq/MgAg (Example A), Glass/ITO/NPB/Alq/LiF/Al/Ag/Alq/Al (Example D) and Glass/ITO/NPB/Alq/Sm/Alq/Al (Example E). The data of the spectral reflectance are displayed in FIG. 7. It is evident that the reflectance in Example A is between 80% and 90% in the entire range of visible light (420–660 nm), similar results could be obtained if an Al cathode is replaced for the MgAg cathode. In Example D, the insertion of an Ag/Alq bilayer between an Al surface layer and an Alq electron-transport layer substantially reduces the reflectance at intermediate wavelengths (around 520 nm), while the reflectance for blue and red light remains considerably high. In Example E, the insertion of a bilayer Sm/Alq between an Al surface layer and an Alq electron-transport layer substantially reduces the reflectance to less than 10% in the entire range of visible light. The pronounced difference is attributed to substantially low refractive indices of silver than those of Sm.

Computer simulation has also been performed on the structure of the prior art (FIG. 3) and the results are compared to the structures of FIGS. 4–6 constructed in accordance with embodiments of the present invention.

Figure 8:
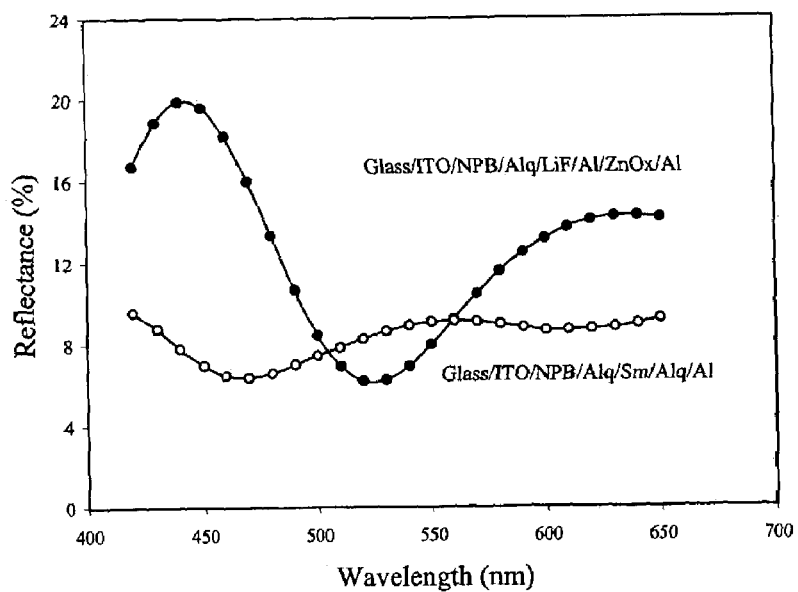
FIG. 8 shows in graphic form the spectral reflectance of a prior art organic light-emitting device of FIG. 3 and an organic light-emitting device of FIG. 4.
Figure 9:
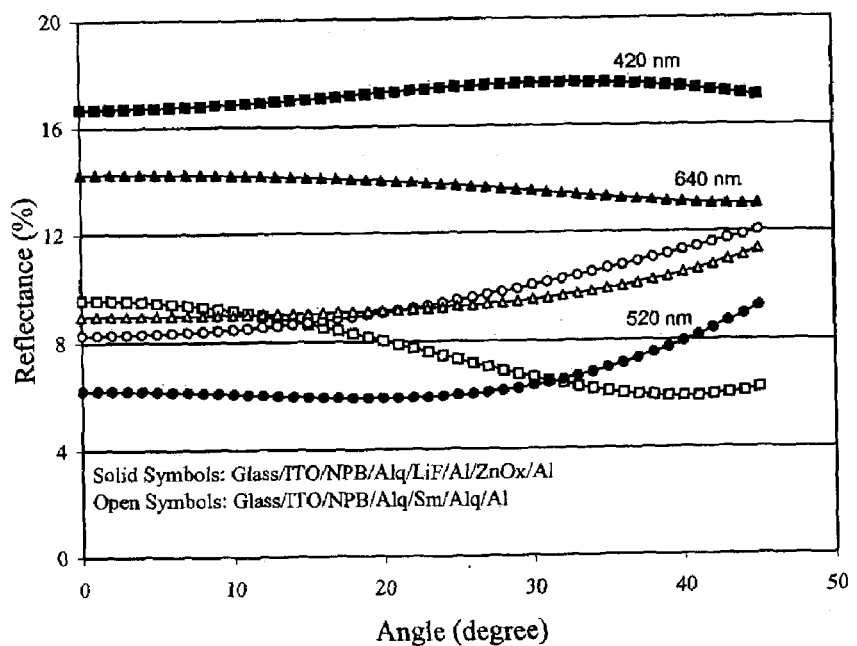
FIG. 9 shows the reflectance as a function of incident angle at the wavelengths of 420, 520, and 640 nm for a prior art organic light-emitting device of FIG. 3 and an organic light-emitting device of FIG. 4.

FIG. 8 shows in graphic form a comparison of the spectral reflectance of a prior art organic light-emitting device of glass/ITO/NPB/Alq/LiF/Al/ZnOx/Al (Example C) and an organic light-emitting device of glass/ITO/NPB/Alq/Sm/Alq/Al. (Example E). The reflectance in Example C increases drastically at low and high wavelengths and becomes considerably higher than 10%, however, the reflectance in Example E varies mildly with a value below 10% in the entire region of visible light. The difference is more pronounced when the reflectance is plotted as a function of incident angle for blue (420 nm), green (520 nm) and red (640 nm) in FIG. 9. The reflectance of Example E is slightly higher than that of Example C at 520 nm, while it is drastically lower than that of Example C at 420 nm and 650 nm. All the results clearly demonstrate that the Sm/Alq/Al structure is more effective in reducing ambient-light-reflection than the LiF/Al/ZnOx/Al structure.

Figure 10:
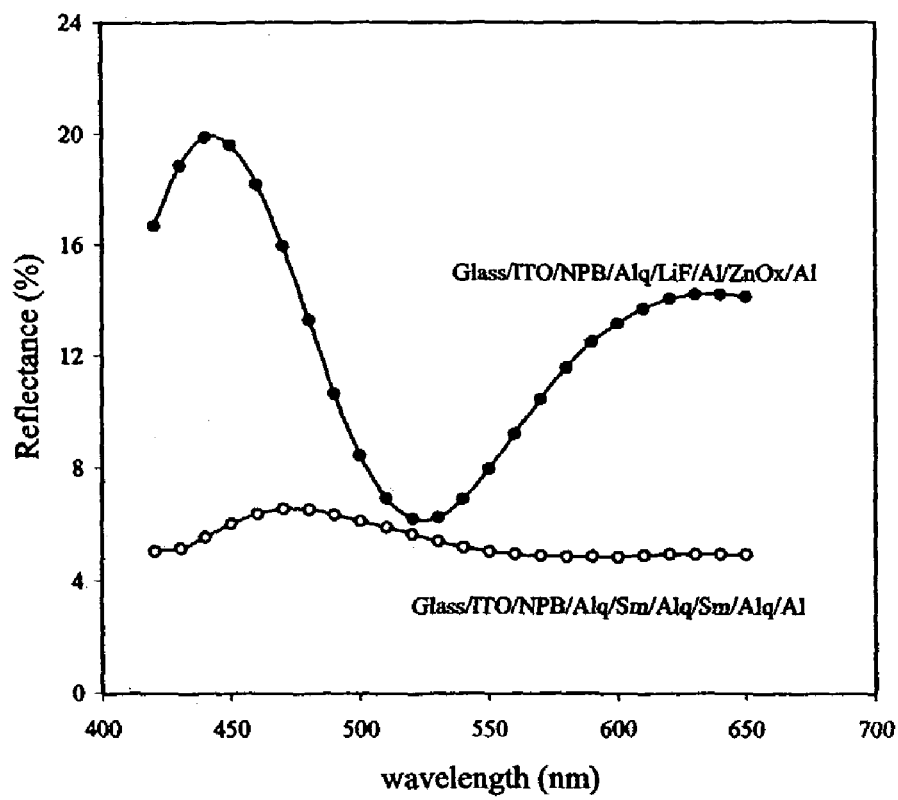
FIG. 10 shows in graphic form the spectral reflectance of a prior art organic light-emitting device of FIG. 3 and an organic light-emitting device of FIG. 5.
Figure 11:
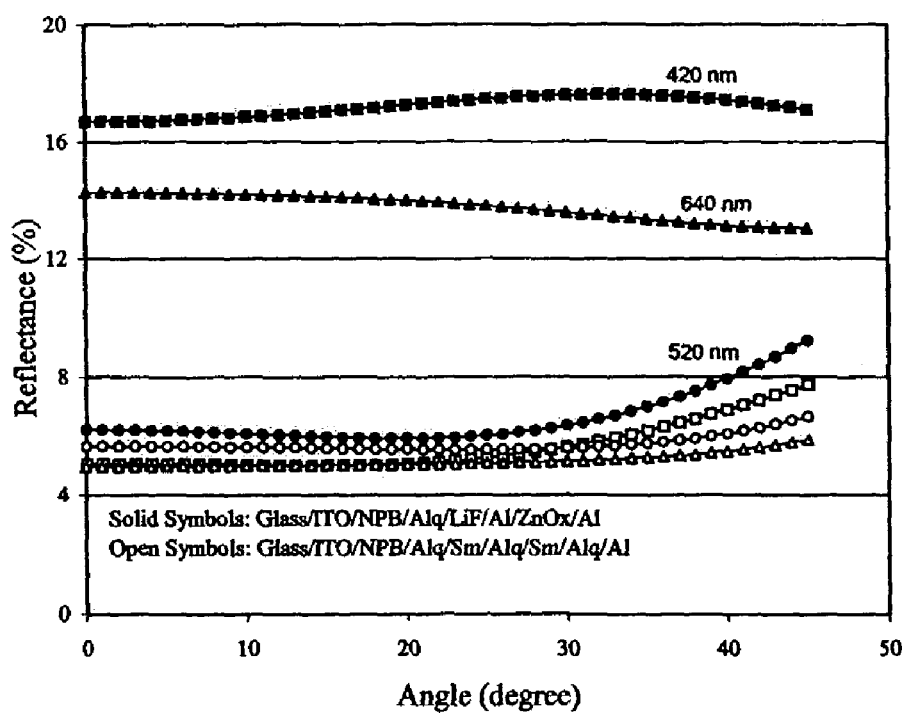
FIG. 11 shows the reflectance as a function of incident angle at the wavelengths of 420, 520, and 640 nm for a prior art organic light-emitting device of FIG. 3 and an organic light-emitting device of FIG. 5.

FIG. 10 shows in graphic form a comparison of the spectral reflectance of a prior art organic light-emitting device of glass/ITO/NPB/Alq/LiF/Al/ZnOx/Al (Example C) and an organic light-emitting device of glass/ITO/NPB/Alq/Sm/Alq/Sm/Alq/Al. (Example F). The reflectance in Example C increases drastically at low and high wavelengths and becomes significantly higher than 10%, however, the reflectance in Example F varies mildly with a value between 5% and 6% in the entire region of visible light. The difference is more pronounced in FIG. 11 when the reflectance is plotted as a function of incident angle for blue (420 nm), green (520 nm) and red (650 nm). The reflectance of Example F is slightly lower at 520 nm but is significantly lower at 520 nm and 640 nm than that of Example E. All the results clearly demonstrate that the Sm/Alq/Sm/Alq structure is more effective in reducing ambient-light-reflection than the Sm/Alq structure.

Figure 12:
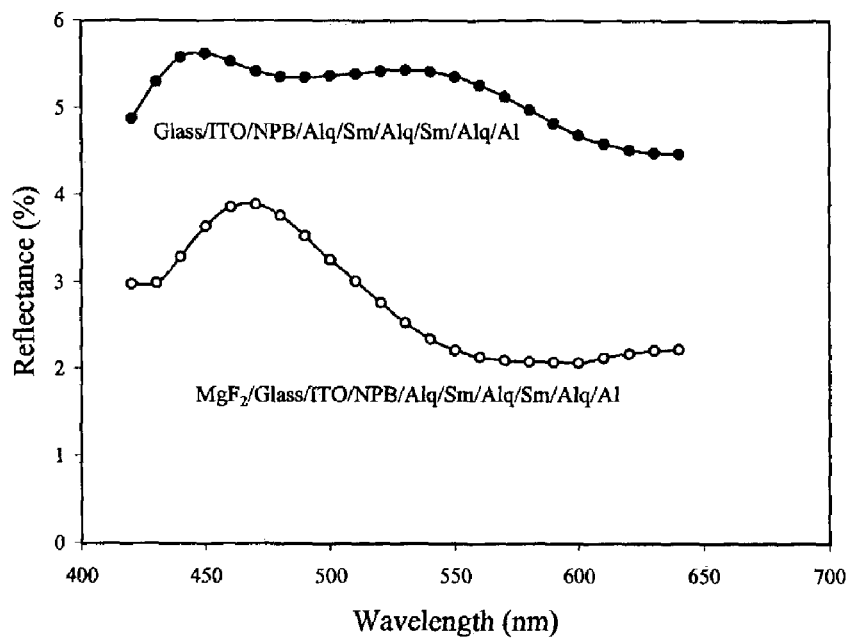
FIG. 12 shows in graphic form the spectral reflectance of an organic light-emitting device of FIG. 5 and an organic light-emitting device of FIG. 6.
Figure 13:
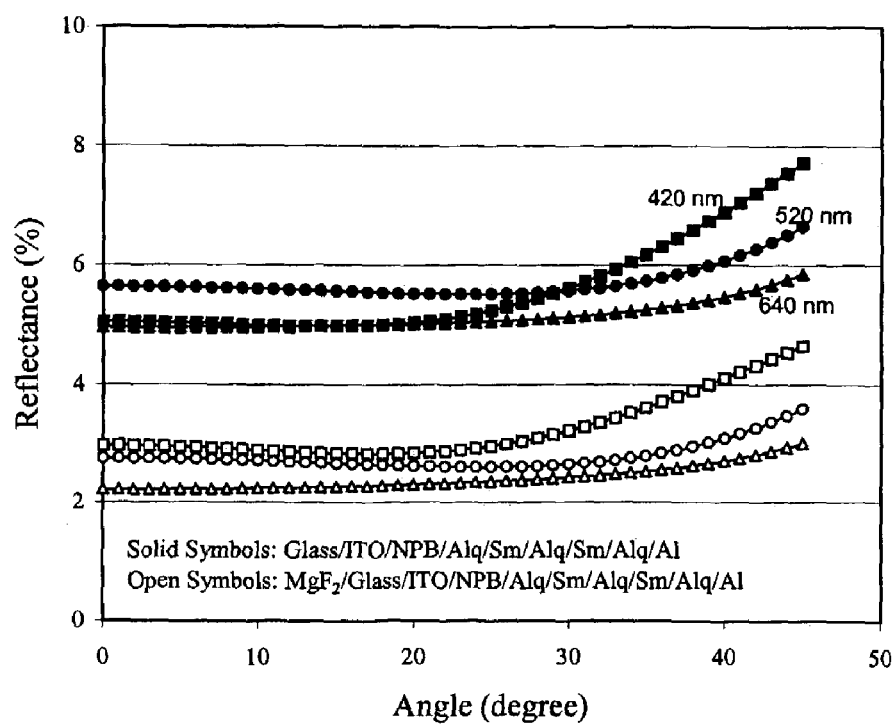
FIG. 13 shows the reflectance as a function of incident angle at the wavelengths of 420, 520, and 640 nm for an organic light-emitting device of FIG. 5 and an organic light-emitting device of FIG. 6.

The lowest reflectance is observed in Example G. FIG. 12 shows in graphic form a comparison of the spectral reflectance of an organic light-emitting device of glass/ITO/NPB/Alq/Sm/Alq/Sm/Alq/Al (Example F) and an organic light-emitting device of $MgF_2$/glass/ITO/NPB/Alq/Sm/Alq/Sm/Alq/Al. (Example G). The addition of a MgF2 layer at the back-side of the glass substrate of Example F further reduces the value of the reflectance, as is shown in the plots of reflectance-wavelength (FIG. 12) and reflectance-incident angle (FIG. 13). The reflectance in Example G is in the range of 2–4% for visible light and the increase in the reflectance with incident angle is very small.

2. Experiments

In the first prior art example $CaB_6$ was selected. However, the thermal evaporation of $CaB_6$ required elevated temperatures, and the material decomposed prior to sublimation. As a result, the deposited film contained substantially less boron than its stoichiometric composition, and a large amount of oxygen was observed in the film by x-ray photoelectron spectrometry and attributed to the high reactivity of calcium with oxygen. As the control of the film composition was extremely difficult, significant variations in optical and electrical properties of the deposited films were commonly observed from specimen to specimen. A stoichiometric composition may be achievable by using sputter-deposition or laser ablation, whereas ion irradiation in the deposition process could severely damage the organic layer stack.

Zinc oxide is transparent and highly resistive when the oxide has a stoichiometric composition, however, it becomes absorbing and conductive when being processed in an oxygen-deficient ambient. In another prior art, an absorbing film was prepared by electron-beam evaporation of zinc oxide at low oxygen partial pressures and interposed between a highly reflective Al cathode and an organic electron-transport layer of Alq. Zinc oxide films prepared in this work look brownish and opaque.

However, the deposition of oxygen-deficient zinc oxide by electron beam is not compatible to OLED preparation, as the devices are extremely sensitive to radiation damage incurred in the deposition process. It is also difficult to control the composition of the absorbing ZnOx layer, and any deviation from an optimum composition would result in a significant change in its resistivity and refractive index and absorbance, and thus considerably affect optical interference. However, when the elemental metal such samarium was used in the present invention, we did not experience any difficulties in depositing our desired film and achieving superior reproducibility.

Figure 14:
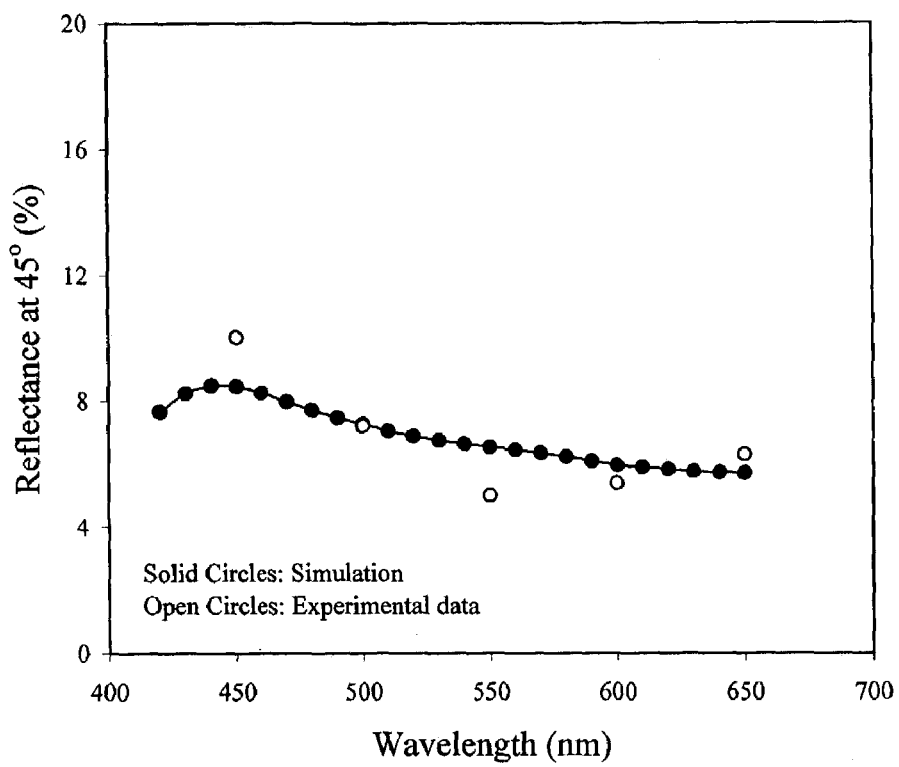
FIG. 14 shows in graphic form a measured relationship between reflectance (reflection beam intensity versus incident beam intensity) and wavelength of an incident light beam used in a reflectance spectrophotometer for an organic-light emitting device of FIG. 5.

FIG. 14 shows in graphic form a measured relationship between reflectance (reflection beam intensity versus incident beam intensity) and wavelength of an incident light beam used in reflectance spectrophotometer. The reflectance trace of the inventive device of FIG. 5 having a multilayer structure of Sm/Alq/Sm/Alq/Al (Example G) is plotted relative to the reflectance trace of the standard device of FIG. 1 (Example A). The reflectance of the inventive device is reduced to less than 10% in the entire range of visible light and is consistent with our simulation.

Figure 15:
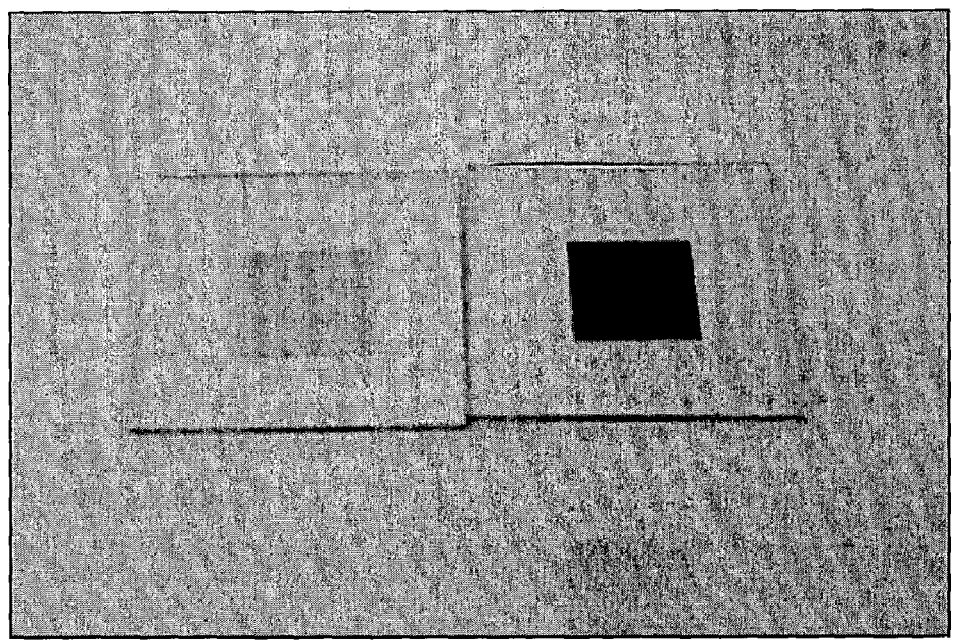
FIG. 15 is a photographic rendition of a standard organic light-emitting device of FIG. 1 (left-side) and an organic light-emitting device of FIG. 5 (right-side)

FIG. 15 shows photographs taken from the control device having a reflective cathode of FIG. 1 (left) and the device having a reflection-less cathode stack of Sm (17 nm)/Alq (61 nm)/Sm (60 nm)/Alq (61 nm)/Al (100 nm) (right). The two multilayer structures were simultaneously photographed under fluorescent room light conditions and by using a flash attachment with the camera. A highly reflective cathode is shown in the left of FIG. 15, while a low-reflectance "black" cathode is shown in the right of FIG. 15 demonstrating the effectiveness of the invented structure in reducing ambient-light-reflection (fluorescent room lights plus flash) from these cathodes. It is apparent from FIGS. 10, 11, 14 and 15 that the new structure could provide a substantially enhanced contrast under ambient-light conditions ranging from ambient fluorescent lighting to higher intensity ambient lighting.

Figure 16:
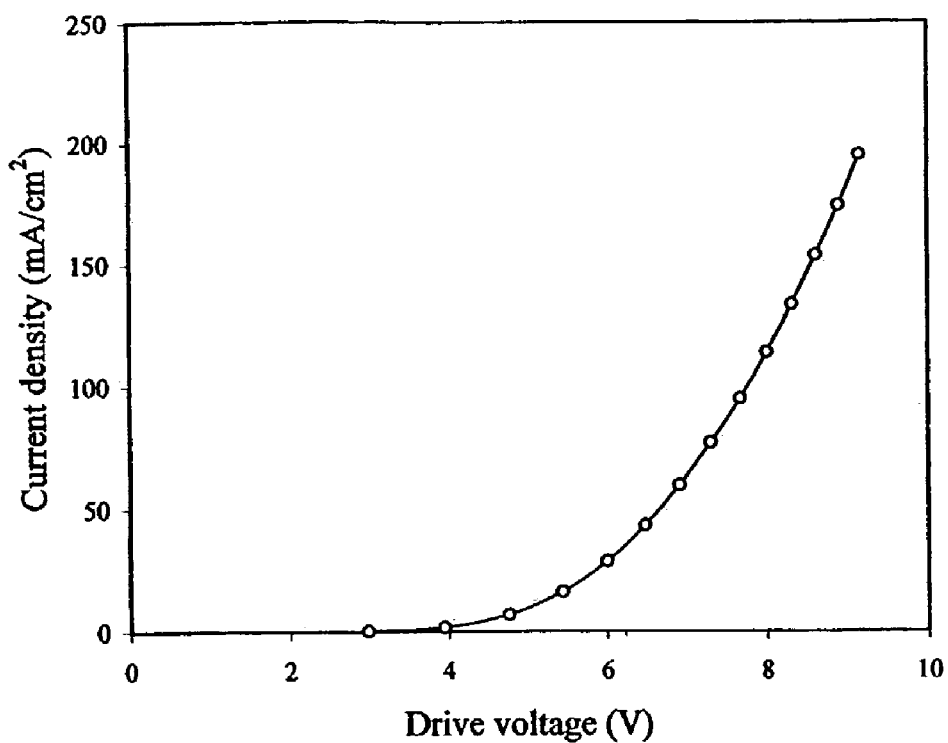
FIG. 16 shows in graphic form a current density-drive voltage relationship of an organic light-emitting device of FIG. 5.
Figure 17:
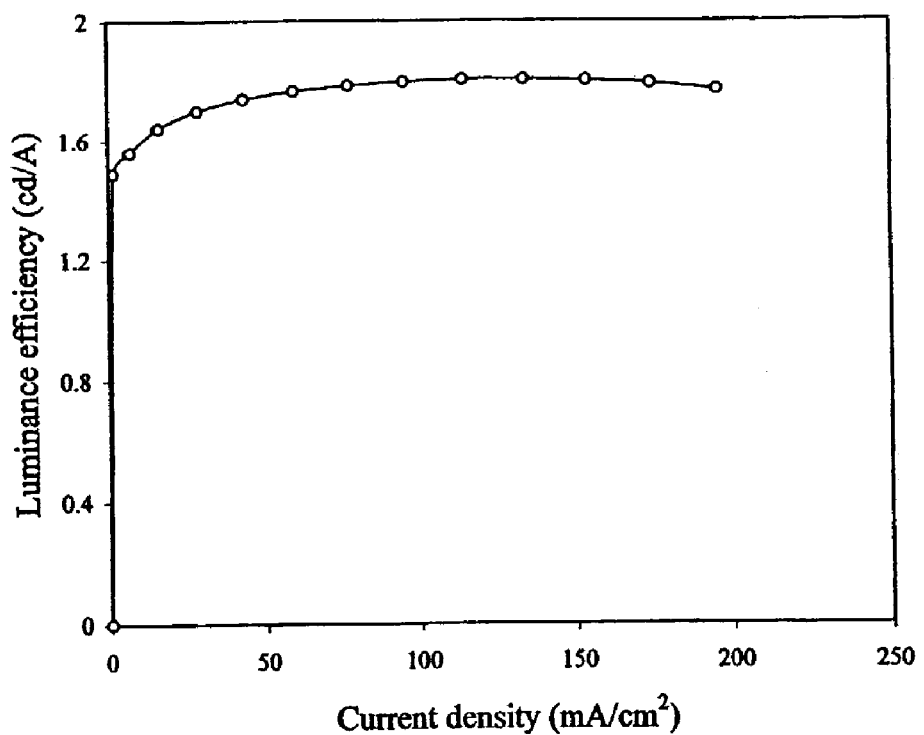
FIG. 17 shows in graphic form a luminance-current density relationship of an organic light-emitting device of FIG. 5.

FIG. 16 shows a relationship between the current density and applied drive voltage for the device of glass/ITO/NPB/Alq/Sm/Alq/Sm/Alq/Al. The current-voltage characteristics of the device are almost identical to those observed from a standard device, indicating the effectiveness of samarium as a cathode. However, in FIG. 17 the luminance of the device with a structure of Sm/Alq/Sm/Alq/Al was approximately 50% of the luminance of the standard device at a selected current density. Such luminance reduction is expected, as light emission from the emissive layer in a direction toward the cathode is not reflected from the surface of the cathode stack, whereas the standard device reflects all of the light substantially.

Viewing FIGS. 7–17 together, it will be appreciated that the inventive device (Examples E–G) provides a substantially enhanced contrast for viewing light from this embodiment of the reduced ambient-light reflectance organic light-emitting device under ambient-light conditions ranging from ambient fluorescent lighting to higher intensity ambient lighting.

The invention has been described in detail with particular reference to certain preferred embodiments thereof, but it will be understood that variations and modifications can be effected within the spirit and scope of the invention.

What is claimed is:

1. An organic light-emitting device, comprising:
    (a) a light-transmissive substrate;
    (b) a light-transmissive anode disposed over the substrate;
    (c) an organic light-emitting structure disposed over the anode;
    (d) a semi-transparent cathode disposed over the light-emitting structure and which is formed of a metal which has a work function below 4.0 eV and a refractive index equal to or greater than 1 at the wavelengths of 400–700 nm;

(e) a multilayer structure disposed over the cathode comprising a phase-changing layer formed over the cathode and a reflective metallic layer formed over the phase-changing layer, wherein the multilayer structure substantially reduces reflection of ambient light and substantially reduces reflection of light emitted by the organic light emitting structure by causing reflected beams within the device to destructively interfere with one another.

2. An organic light-emitting device as claimed in claim 1 wherein the organic light-emitting structure comprises:
   (a) an organic hole-transporting layer formed over the anode;
   (b) an organic light-emitting layer formed over the hole-transporting layer; and
   (c) an organic electron-transporting layer formed over the light-emitting layer.

3. An organic light-emitting device as claimed in claim 1 wherein the metal is selected from the group consisting of rare earth metals.

4. An organic light-emitting device as claimed in claim 3 wherein the rare earth metals include Lanthanum, Cerium, Praseodymium, Neodymium, Promethium, Samarium, Europium, Gadolinium, Terbium, Dysprosium, Holmium, Erbium, Thulium and Ytterbium.

5. An organic light-emitting device as claimed in claim 1 wherein the cathode layer is formed of a selected material at a thickness in a range of from 10 to 100 nm.

6. An organic light-emitting device as claimed in claim 1 wherein the phase-changing layer is formed of a transparent organic material or an transparent inorganic material at a thickness ranging from 10 to 100 nm.

7. An organic light-emitting device as claimed in claim 6 wherein the transparent organic materials include α-napthylphenylbiphenyl diamine (NPB) and Tris-(8-hydroxyquinoline) aluminum (Alq).

8. An organic light-emitting device as claimed in claim 6 wherein the transparent inorganic materials are selected from the group of metal oxides and metal fluorides.

9. An organic light-emitting device as claimed in claim 1 wherein the reflective metallic layer is formed of an elemental metal or a metal alloy at a thickness ranging from 50 to 500 nm.

10. An organic light-emitting device as claimed in claim 9 wherein the reflective metallic layer is selected from the group of aluminum and silver.

11. An organic light-emitting device as claimed in claim 1 wherein an anti-reflection coating is provided on the side of the substrate opposite from said anode.

12. An organic light-emitting device as claimed in claim 1 wherein the multilayer structure further comprises:
   (a) an absorbing metal layer formed over the phase-changing layer; and
   (b) a second phase-changing layer formed over the absorbing metal layer.

13. An organic light-emitting device as claimed in claim 12 wherein the phase-changing layers are formed of a transparent organic material or a transparent inorganic material at a thickness in the range of 10–100 nm.

14. An organic light-emitting device as claimed in claim 13 wherein the transparent organic materials include α-napthylphenylbiphenyl diamine (NPB) and Tris-(8-hydroxyquinoline) aluminum (Alq).

15. An organic light-emitting device as claimed in claim 13 wherein the transparent inorganic materials are selected from the group of metal oxides and metal fluorides.

16. An organic light-emitting device as claimed in claim 12 wherein the absorbing metal layer is formed of a metal having a refractive index greater than 1 at the wavelengths of 400–700 nm.

17. An organic light-emitting device as claimed in claim 16 wherein the metal is selected from the group consisting of rare earth metals.

18. An organic light-emitting device as claimed in claim 17 wherein the rare earth metals include Lanthanum, Cerium, Praseodymium, Neodymium, Promethium, Samarium, Europium, Gadolinium, Terbium, Dysprosium, Holmium, Erbium, Thulium and Ytterbium.

19. An organic light-emitting device as claimed in claim 12 wherein the reflective metallic layer is formed of an elemental metal or a metal alloy at a thickness ranging from 50 to 500 nm.

20. An organic light-emitting device as claimed in claim 19 wherein the reflective metallic layer is selected from the group of aluminum and silver.

21. An organic light-emitting device as claimed in claim 12 wherein an anti-reflection coating is provided on the side of the substrate opposite from said anode.

22. An organic light-emitting device, comprising:
   (a) a light-transmissive substrate with an antireflection coating on the backside of the substrate;
   (b) a light-transmissive anode disposed over the substrate;
   (c) an organic light-emitting structure disposed over the anode;
   (d) a semi-transparent cathode disposed over the light-emitting structure and which is formed of a metal with a work function below 4.0 eV and a refractive index equal to or greater than 1 at the wavelengths of 400–700 nm; and
   (e) a multilayer structure disposed over the cathode for reducing reflection of ambient-light entering the device through the substrate and the anode, the multilayer structure comprising a phase-changing layer formed over the cathode, the phase-changing layer having a thickness in the range of 10–100 nm.

23. An organic light-emitting device as claimed in claim 22 wherein the anti-reflection coating is formed of a transparent material with its refractive index equal to or less than 1.4.

24. An organic light-emitting device as claimed in claim 23 wherein the transparent material is selected from the group of metal oxides and metal fluorides.

25. An organic light-emitting device as claimed in claim 24 wherein the metal fluorides include lithium fluoride, magnesium fluoride, calcium fluoride, strontium fluoride, or barium fluoride.

26. An organic light-emitting device, comprising:
   (a) a light-transmissive substrate;
   (b) a light-transmissive anode disposed over the substrate;
   (c) an organic light-emitting structure disposed over the anode;
   (d) a semi-transparent cathode disposed over the light-emitting structure, which is capable of providing electrons into the light-emitting structure; and
   (e) a multilayer structure disposed over the cathode to reduce reflection of ambient-light entering the device through the substrate and the anode, the multilayer structure further comprising a first phase-changing layer formed over the cathode, an absorbing rare earth metal layer formed over the first phase-changing layer and having a refractive index greater than 1 at wavelengths of 400 to 700 nm, a second phase-changing layer formed over the absorbing metal layer, and a reflective metallic layer formed over the second phase-changing layer.

27. The organic light-emitting device of claim 26, wherein the rare earth metal layer includes at least one of Lanthanum, Cerium, Praseodymium, Neodymium, Promethium, Samarium, Europium, Gadolinium, Terbium, Dysprosium, Holmium, Erbium, Thulium and Ytterbium.

28. An organic light-emitting device, comprising:
(a) a light-transmissive substrate;
(b) a light-transmissive anode disposed over the substrate;
(c) an organic light-emitting structure disposed over the anode;
(d) a semi-transparent cathode disposed over the light-emitting structure and which is formed of a metal which has a work function below 4.0 eV and a refractive index equal to or greater than 1 at the wavelengths of 400–700 nm; and
(e) a multilayer structure disposed over the cathode to reduce reflection of ambient-light entering the device through the substrate and the anode, wherein the multilayer structure comprises a phase-changing layer formed over the cathode and a reflective metallic layer formed over the phase-changing layer, the multilayer structure further comprising an absorbing metal layer formed over the phase-changing layer and a second phase-changing layer formed over the absorbing metal layer.

29. An organic light-emitting device as claimed in claim 28 wherein the phase-changing layers are formed of a transparent organic material or a transparent inorganic material at a thickness in the range of 10–100 nm.

30. An organic light-emitting device as claimed in claim 29 wherein the transparent organic materials include α-napthylphenylbiphenyl diamine (NPB) and Tris-(8-hydroxyquinoline) aluminum (Alq).

31. An organic light-emitting device as claimed in claim 29 wherein the transparent inorganic materials are selected from the group of metal oxides and metal fluorides.

32. An organic light-emitting device as claimed in claim 28 wherein the absorbing metal layer is formed of a metal having a refractive index greater than 1 at the wavelengths of 400–700 nm.

33. An organic light-emitting device as claimed in claim 32 wherein the metal is selected from the group consisting of rare earth metals.

34. An organic light-emitting device as claimed in claim 33 wherein the rare earth metals include Lanthanum, Cerium, Praseodymium, Neodymium, Promethium, Samarium, Europium, Gadolinium, Terbium, Dysprosium, Holmium, Erbium, Thulium and Ytterbium.

35. An organic light-emitting device as claimed in claim 28 wherein the reflective metallic layer is formed of an elemental metal or a metal alloy at a thickness ranging from 50 to 500 nm.

36. An organic light-emitting device as claimed in claim 35 wherein the reflective metallic layer is selected from the group of aluminum and silver.

37. An organic light-emitting device as claimed in claim 28 wherein an anti-reflection coating is provided on the side of the substrate opposite from said anode.

* * * * *